(12) United States Patent
Chen et al.

(10) Patent No.: US 9,575,226 B2
(45) Date of Patent: Feb. 21, 2017

(54) POSITIVE MICROCONTACT PRINTING

(71) Applicant: The Chinese University of Hong Kong, Hong Kong (CN)

(72) Inventors: Shih-Chi Chen, Hong Kong (CN); Ni Zhao, Hong Kong (CN); Huihua Xu, Hong Kong (CN); Xi Zhou, Hong Kong (CN)

(73) Assignee: THE CHINESE UNIVERSITY OF HONG KONG, Hong Kong (CN)

( * ) Notice: Subject to any disclaimer, the term of this patent is extended or adjusted under 35 U.S.C. 154(b) by 144 days.

(21) Appl. No.: 14/492,449

(22) Filed: Sep. 22, 2014

(65) Prior Publication Data

US 2016/0085000 A1    Mar. 24, 2016

(51) Int. Cl.

| | |
|---|---|
| *C03C 15/00* | (2006.01) |
| *G02B 5/18* | (2006.01) |
| *C23F 1/00* | (2006.01) |
| *H05K 1/02* | (2006.01) |
| *B81C 1/00* | (2006.01) |
| *C23F 1/44* | (2006.01) |
| *C23C 22/02* | (2006.01) |
| *C23F 1/02* | (2006.01) |
| *C23F 1/14* | (2006.01) |
| *H05K 3/06* | (2006.01) |
| *H05K 1/11* | (2006.01) |

(52) U.S. Cl.
CPC ......... *G02B 5/1857* (2013.01); *B81C 1/00031* (2013.01); *B81C 1/00388* (2013.01); *C23C 22/02* (2013.01); *C23F 1/00* (2013.01); *C23F 1/02* (2013.01); *C23F 1/14* (2013.01); *C23F 1/44* (2013.01); *H05K 1/028* (2013.01); *H05K 1/0296* (2013.01); *H05K 3/061* (2013.01); *H05K 1/118* (2013.01); *H05K 2201/0145* (2013.01); *H05K 2201/0154* (2013.01); *H05K 2203/122* (2013.01)

(58) Field of Classification Search
CPC ............. B81C 1/00031; B81C 1/00388; B81C 2201/0191; C23F 1/02; C23F 1/44; C23F 1/00
USPC .......................... 216/41, 49, 54, 95, 96, 100
See application file for complete search history.

(56) References Cited

U.S. PATENT DOCUMENTS

| | | | | |
|---|---|---|---|---|
| 2011/0232515 | A1* | 9/2011 | Millward | B82Y 10/00 101/333 |
| 2013/0202729 | A1* | 8/2013 | Rolland | B29C 33/40 425/406 |
| 2013/0228950 | A1* | 9/2013 | DeSimone | C08L 71/02 264/226 |
| 2014/0054732 | A1* | 2/2014 | Murarka | B81C 1/00158 257/419 |

(Continued)

OTHER PUBLICATIONS

Wiktionary, the free dictionary, "Trihydrochloride" via https://en.wiktionary.org/wiki/trihydrochloride ; 1 page; 2016.*

(Continued)

*Primary Examiner* — Binh X Tran
(74) *Attorney, Agent, or Firm* — Knobbe Martens Olson & Bear LLP

(57) ABSTRACT

A process for positive microcontact printing, including inking a patterned mold with a thiol; contacting the mold with a metal surface of a substrate; backfilling the metal surface with a solution containing an aromatic amine to form a backfilling layer; etching the metal surface of the substrate; and rinsing the substrate to remove the backfilling layer.

17 Claims, 3 Drawing Sheets

(56) References Cited

U.S. PATENT DOCUMENTS

2015/0036117 A1\* 2/2015 Menon ................. G03F 7/0002
 355/72
2015/0079351 A1\* 3/2015 Atasoy ................. G03F 7/0002
 428/172
2015/0309073 A1\* 10/2015 Mirkin ................. B82Y 40/00
 850/55

OTHER PUBLICATIONS

Wikipedia, The Free Encyclopedia, "Propylene glycol" via https://en.wikipedia.org/wiki/Propylene_glycol ; 9 pages; 2016.\*
Wikipedia, The Free Encyclopedia; "Ether" via https://en.wikipedia.org/wiki/Ether ; 8 pages; 2016.\*

\* cited by examiner

POSITIVE MICROCONTACT PRINTING

FIELD

The present application relates to microcontact printing.

BACKGROUND

Fabrication of submicron to nanometer level resolution patterns/structures is of great importance in microelectronics. Commonly used methods in electronics industry—photolithography, X-ray, electron-beam lithography, etc.—are well suited to generate micrometer to nanometer scale structures of radiation-sensitive materials on smooth, rigid surfaces. However, these established techniques involve high capital and operating expenses as well as specific operating environment (e.g. a clean room). Furthermore, these methods all require a flat and rigid substrate, and are not suitable for patterning on curved, flexible or large scale substrates. In addition, there is an increasing need to move the fabrication process outside of the clean room, pattern on a wide range of flexible substrates, increase the throughput and keep the cost as low as possible. The conventional micro-/nano-fabrication methods developed for microelectronics apparently cannot meet these goals.

The standard microcontact printing techniques are limited by their repeatability, scalability and limited throughput due to inefficient chemical deposition, developing, and etching processes.

SUMMARY

Some embodiments relate to a process for positive microcontact printing, comprising inking a patterned mold with a thiol; contacting the mold with a metal surface of a substrate; backfilling the metal surface with a solution containing an aromatic amine to form a backfilling layer; etching the metal surface of the substrate; and rinsing the substrate to remove the backfilling layer.

Some embodiments relate to a nanoscale optical grating, wherein grating patterns are fabricated on a flexible substrate with the process for positive microcontact printing in this disclosure.

Some embodiments relate to a nanoscale electrode, wherein electrode patterns are fabricated on a flexible substrate with the process for positive microcontact printing in this disclosure.

BRIEF DESCRIPTION OF THE DRAWINGS

FIG. 2a shows a digital image of the gold-nanograting arrays. The light diffraction from the periodic gratings can be observed clearly. FIGS. 2b-d show SEM images of the nanogratings with 600 nm line width, 600 nm spacing (FIG. 2b); 400 nm line width, 400 nm spacing (FIG. 2c); and 300 nm line width, 300 nm spacing (FIG. 2d).

DETAILED DESCRIPTION

Figure 1:
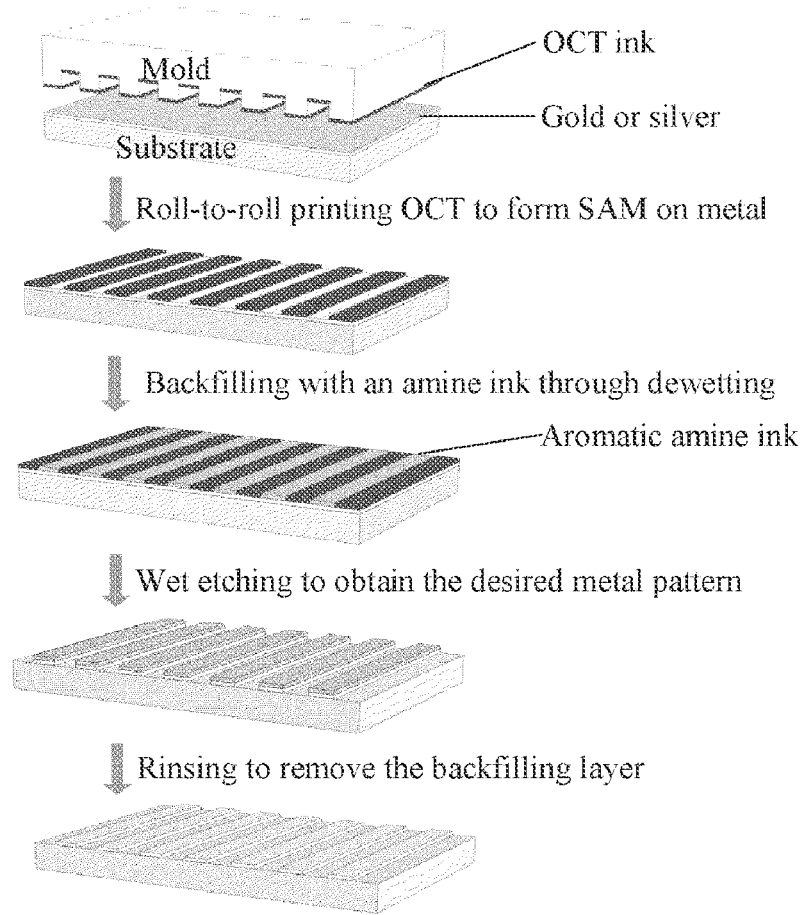
FIG. 1 schematically illustrates the positive microcontact printing in some embodiments.

In the following description, certain specific details are included to provide a thorough understanding for various disclosed embodiments. One skilled in the relevant art, however, will recognize that the embodiments may be practiced without one or more these specific details, or with other methods, components, materials, etc.

Unless the context required otherwise, throughout the specification and claims which follows, the term "comprise" and variations thereof, such as "comprises" and "comprising" are to be construed in an open, inclusive sense, which is as "include, but not limited to".

Reference throughout this specification to "one embodiment", or "an embodiment", or "in another embodiment", or "in some embodiments" means that a particular referent feature, structure or characteristic described in connection with the embodiments is included in at least one embodiment. Therefore, the appearance of the phrases "in one embodiment", or "in the embodiment", or "in another embodiment", or "in some embodiments" in various places throughout this specification are not necessarily all referring to the same embodiment. Moreover, the particular features, structures or characteristics may be combined in any suitable manner in one or more embodiments.

It should be noted that, as used in this specification and the appended claims, the singular forms "a", "an" and "the" include plural referents unless the context clearly stated otherwise. Therefore, for example, a reaction comprising "a catalyst" comprises one catalyst, two or more catalysts. It should be also noted that the use of "or" means "and/or" unless stated otherwise.

Some embodiments relate to a process for positive microcontact printing, comprising inking a patterned mold with a thiol; contacting the mold with a metal surface of a substrate; backfilling the metal surface with a solution containing an aromatic amine to form a backfilling layer; etching the metal surface of the substrate; and rinsing the substrate to remove the backfilling layer.

The backfilling molecules provide a moderate adhesion to the metal such that they can protect the metal during the etching process while being easily removed in the final rinsing step.

Ionic aromatic amine molecules are used as the backfilling material. Weak coordination between the nitrogen and metal (e.g. gold or silver) atoms was exploited to meet the adhesion requirement.

In some embodiments, an aromatic amine is represented by formula (I)

$$[Ar-(NRR')_n]^{m+} \qquad (I)$$

wherein Ar represents an aryl group having 6 to 18 carbon atoms or a heteroaromatic group having 4 to 17 carbon atoms; each of R and R' independently represents a hydrogen atom, a methyl group, or a ethyl group; n is 1, 2, or 3; and m is 0, 1, 2, or 3.

In some embodiments, n is 2.

Exemplary aromatic amine that can be used in various embodiments includes, but is not limited to, 2,4,6-trimethylbenzene-1,3,5-triamine tri-hydrochloride; 3,6-diaminoacridine hydrochloride; 3,7-bis(Dimethylamino)phenazathionium chloride; 9-aminoacridine hydrochloride; and 2-(4-dimethylaminophenylazo)benzoic acid.

In some embodiments, the surface is backfilled with a solution containing an aromatic amine to form a backfilling layer through dewetting.

The backfilling process produces a uniform and robust protection layer with well-defined edges. This becomes exceedingly important when producing nanopatterns with low defect density over a large area.

In some embodiments, aromatic amine is dissolved in a mixture of at least one monohydroxyl alcohol and one or more glycol ethers to obtain the solution containing an aromatic amine.

Exemplary monohydroxyl alcohol that can be used in various embodiments includes, but is not limited to, ethyl alcohol, isopropyl alcohol, n-propyl alcohol, allyl alcohol, and n-butyl alcohol.

Exemplary glycol ether that can be used in various embodiments includes, but is not limited to, n-propyl glycol, isopropyl glycol, n-butyl glycol, diacetone alcohol, and methoxy butanol.

A mixture of at least one monohydroxyl alcohol and one or more glycol ethers was chosen due to its low-toxicity, moderate drying speed (three seconds under a nitrogen stream) and ability to fully dissolve the backfilling molecules.

In some embodiments, an aromatic amine is dissolved in a mixture of ethanol and diacetone alcohol (DAA) (9:1, v/v).

In some embodiments, 3,6-diaminoacridine hydrochloride is dissolved in a mixture of ethanol and diacetone alcohol (DAA) (9:1, v/v).

Exemplary thiol that can be used in various embodiments includes, but is not limited to, n-dodecanethiol, n-tetradecanethiol, n-hexadecanethiol, and n-octadecylthiol Exemplary metal surface that can be used in various embodiments includes, but is not limited to, gold and silver.

The backfilled aromatic amine molecular etch resist allows the use of aggressive etchants. This significantly shortens the time of metal etching, the rate-limiting step of the roll-to-roll process.

In some embodiments, etching is carried out with potassium iodide-iodine etchant system or sodium iodide-iodine etchant system.

Exemplary substrate that can be used in various embodiments includes, but is not limited to, plastic films.

Exemplary substrate that can be used in various embodiments includes, but is not limited to, poly(ethylene naphthalate) (PEN), poly(ethylene terephthalate) (PET), polyethylenimine (PEI), and polyimide (PI).

In some embodiments, the substrate is flexible.

Exemplary mold that can be used in various embodiments includes, but is not limited to, 184-PDMS, composite h/184-PDMS, polyolefin plastomer (POP), and poly(urethane acrylate).

Exemplary solvent that can be used for rinsing in various embodiments includes, but is not limited to, ethyl alcohol, isopropyl alcohol, acetone, and deionized water.

Some embodiments relate to a nanoscale optical grating, wherein grating patterns are fabricated on a flexible substrate with the process as described herein.

Some embodiments relate to a nanoscale electrode, wherein electrode patterns are fabricated on a flexible substrate with the process as described herein.

EXAMPLES

Although anyone skilled in the art is capable of preparing the compounds of the present application according to the general techniques disclosed above, more specific details on synthetic techniques for compound of the present application are provided elsewhere in this specification for convenience. Again, all reagents and reaction conditions employed in synthesis are known to those skilled in the art and are available from ordinary commercial sources.

Chemicals and reagents. All commercial reagents were obtained from Aldrich Chemical Co. and used without further purification unless otherwise specified. Hard PDMS components: (7.0-8.0 vinylmethylsiloxane)-dimethylsiloxane copolymer (VDT-731), platinum-divinyltetramethyldisiloxane (SIP6831.2), 1,3,5,7-tetravinyl-1,3,5,7-tetramethylcyclotetrasiloxane (SIT7900.0), and (25-30 methylhydrosiloxane)-dimethylsiloxane copolymer (HMS-301) were purchased from Gelest. The soft PDMS elastomer kit (Sylard 184) was ordered from Dow corning. The alkanethiol solution was prepared by dissolving 1-octadecylthiol in ethanol to obtain a concentration of 5 mM. The amine backfilling solution was prepared by dissolving 10 mg·ml$^{-1}$ 3,6-diaminoacridine hydrochloride in a mixture of ethanol and diacetone alcohol and then immediately filtered through 0.22 μm syringe filters before use.

Metal etchant. A potassium iodide/iodine mixture solution was selected as the etchant of gold and silver due to its high reactivity and low toxicity. For gold etching, a commercial potassium iodide/iodine formula (Gold Etchant TFA) was used. For the more reactive silver, an aqueous solution of 1.2 M potassium iodide mixed with 0.03 M iodine was prepared.

Substrate preparation. The PET substrate was obtained from Dupont and had a thickness of 265 gauge. The substrates were ultrasonically cleaned with acetone, IPA and deionized water, and finally blow-dried with nitrogen. A 40-nm gold or silver layer was then sputter deposited on the PET substrate.

PDMS mold. Sylard 184 was used for fabricating molds at micrometer-scale. The 184-PDMS molds were fabricated by spin coating the prepolymer mixture on photolithographic ally prepared 4-inch silicon masters with micrometer-scale patterned photoresist. The features of the silicon master were replicated on the PDMS mold surface after curing, and the thin PDMS mold was peeled off the master, wrapped around a 36 mm diameter cylindrical glass roller and inked with a 5 mM ethanol solution of OCT.

Composite molds composed of a hard PDMS layer supported by a soft 184 PDMS layer were used to replicate nanogratings on the silicon master. The 4-inch silicon master with five periodic grating patterns with line width and spacing of 300 nm, 400 nm and 600 nm, respectively, was fabricated by e-beam lithography and dry etching. The composite PDMS molds were prepared according to conventional procedure in the art. After curing, the PDMS mold was peeled away, wrapped around the cylindrical roller and inked with the OCT solution prior to use.

Example 1

Preparation of Nanoscale Gold Optical Gratings on Large-Area Flexible PET Substrates Using the Roll-to-Roll Microcontact Printing System The PDMS mold with five relief periodic grating patterns with line width and spacing of 300 nm, 400 nm and 600 nm, respectively, was wrapped around a 36 mm diameter cylindrical glass roller and inked with a 5 mM ethanol solution of ethanolic 1-octadecylthiol (OCT). The OCT ink on the cylindrical PDMS mold was roll-to-roll printed across a 40-nm thick gold surface on a PET substrate to generate OCT SAM (self-assembled monolayer). The rolling speed was 0.01 m·s$^{-1}$ and the printing pressure was 3 N. Then, the backfilling solution was cast on the patterned substrate to backfill the rare gold areas. After the backfilling ink dewetting and drying under a nitrogen stream, the sample was immersed in gold etchant for 6 seconds to selectively remove the gold regions covered by OCT SAM, and the positive replica of the silicon master was obtained after rinsing away the backfilling layer with ethanol and deionized water. The samples were investigated by optical microscopy (Micromanipulator 7000) and desktop scanning electron microscopy (SEM) (Phenim ProX). The AFM image was taken with a VEECO Dimension™ 3100.

Figure 2A:
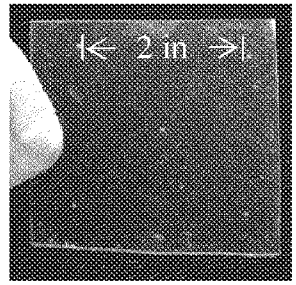
FIGS. 2A-D show gold nanograting patterns on flexible PET substrates fabricated by roll-to-roll microcontact printing.
Figure 2B:
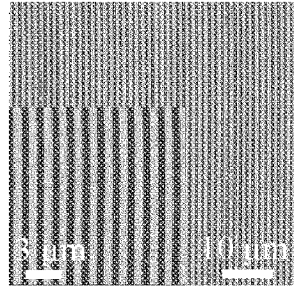
Figure 2C:
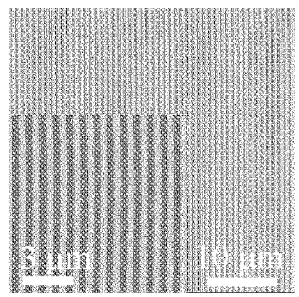
Figure 2D:
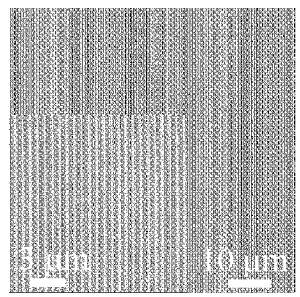

As shown in FIG. 2a, the patterns are up to 3 inches apart, demonstrating that the newly developed microcontact printing is capable of large-area nanopatterning. The SEM images (FIG. 2b, 2c, 2d) of the patterns reveal the high uniformity of the gold lines as well as the cleanness of the substrate after etching.

Example 2

Preparation of Microscale Gold Patterns as Electrodes for Photodetectors on Flexible PET Substrates Using the Roll-to-Roll Microcontact Printing System The preparation process is almost the same as described in Example 1, while the rolling speed and printing pressure were increased to 0.02 m·s$^{-1}$ and 15 N, respectively. The samples were investigated by optical microscopy (Micromanipulator 7000) and desktop scanning electron microscopy (SEM) (Phenim ProX). The AFM image was taken with a VEECO Dimension™ 3100.

Figure 3:
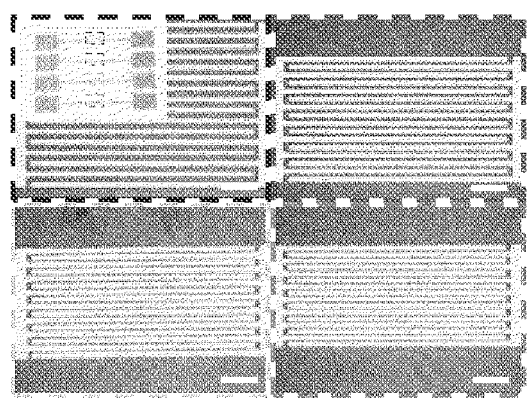
FIG. 3 shows gold interdigitated electrodes on flexible PET substrates fabricated by roll-to-roll microcontact printing. Optical images of gold interdigitated microelectrodes with different electrode spacing (L): black dashed box, L=15 μm; red dashed box, L=10 μm; yellow dashed box, L=5 μm; blue dashed box, L=3 μm (Scale bar, 100 μm). The inset shows the electrodes array.

As shown in the inset of FIG. 3, gold interdigitated electrodes with channel lengths of 15 µm, 10 µm, 5 µm and 3 µm are obtained simultaneously through one printing pass. These gold micro-patterns were successfully used as the electrodes for organic photodetectors and demonstrate good performance.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for positive microcontact printing, comprising
   inking a patterned mold with a thiol;
   contacting the mold with a metal surface of a substrate;
   backfilling the metal surface with a solution containing an aromatic amine to form a backfilling layer;
   etching the metal surface covered by the thiol; and
   rinsing the substrate to remove the backfilling layer.

2. The process of claim 1, wherein the metal surface is backfilled with a solution containing an aromatic amine to form a backfilling layer through dewetting.

3. The process of claim 1, wherein the thiol is selected from the group consisting of n-dodecanethiol, n-tetradecanethiol, n-hexadecanethiol, and n-octadecylthiol.

4. The process of claim 1, wherein the thiol is printed on the metal surface of the substrate with a roll-to-roll printing.

5. The process of claim 1, wherein the metal surface is formed with gold or silver.

6. The process of claim 1, wherein the etching is carried out with potassium iodide-iodine etchant system or sodium iodide-iodine etchant system.

7. The process of claim 1, wherein the substrate is flexible.

8. The process of claim 1, wherein the substrate is a plastic film.

9. The process of claim 1, wherein the substrate is selected from the group consisting of poly(ethylene naphthalate) (PEN), poly(ethylene terephthalate) (PET), polyethylenimine (PEI), and polyimide (PI).

10. The process of claim 1, wherein the mold is selected from the group consisting of 184-PDMS, composite h/184-PDMS, polyolefin plastomer (POP), and poly(urethane acrylate).

11. The process of claim 1, wherein the rinsing is carried out with ethyl alcohol, isopropyl alcohol, acetone, or deionized water.

12. The process of claim 1, wherein the aromatic amine is represented by formula (I)

$$[Ar\text{---}(NRR')_n]^{m+} \quad (I)$$

wherein Ar represents an aryl group having 6 to 18 carbon atoms or a heteroaromatic group having 4 to 17 carbon atoms; each of R and R' independently represents a hydrogen atom, a methyl group, or a ethyl group; n is 1, 2, or 3; and m is 0, 1, 2, or 3.

13. The process of claim 12, wherein n is 2.

14. The process of claim 12, wherein the aromatic amine is selected from the group consisting of 2,4,6-trimethylbenzene-1,3,5-triamine tri-hydrochloride; 3,6-diaminoacridine hydrochloride; 3,7-bis(Dimethylamino)phenazathionium chloride; 9-aminoacridine hydrochloride; and 2-(4-dimethylaminophenylazo)benzoic acid.

15. The process of claim 1, wherein the aromatic amine is dissolved in a mixture of at least one monohydroxyl alcohol and one or more glycol ethers compounds to obtain the solution containing an aromatic amine.

16. The process of claim 15, wherein the monohydroxyl alcohol is selected from the group consisting of ethyl alcohol, isopropyl alcohol, n-propyl alcohol, allyl alcohol, n-butyl alcohol and diacetone alcohol.

17. The process of claim 15, wherein the glycol compound is selected from the group consisting of n-propyl glycol, isopropyl glycol, n-butyl glycol, and methoxy butanol.

* * * * *

UNITED STATES PATENT AND TRADEMARK OFFICE
CERTIFICATE OF CORRECTION

PATENT NO.        : 9,575,226 B2
APPLICATION NO.   : 14/492449
DATED             : February 21, 2017
INVENTOR(S)       : Shih-Chi Chen et al.

It is certified that error appears in the above-identified patent and that said Letters Patent is hereby corrected as shown below:

In the Specification

Column 3, Line 29, after "n-octadecylthiol" insert --.--.
Column 4, Line 12, "(Sylard" should be --(Sylgard--.
Column 4, Line 31, "Sylard" should be --Sylgard--.
Column 5, Line 8, "(Phenim" should be --(Phenom--.
Column 5, Line 13, "(FIG." should be --(FIGS.--.
Column 5, Line 29, "(Phenim" should be --(Phenom--.

In the Claims

Column 6, Line 45 (Claim 15), after "glycol" delete "ethers".

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*